US009870159B2

(12) United States Patent
Cepulis

(10) Patent No.: US 9,870,159 B2
(45) Date of Patent: Jan. 16, 2018

(54) SOLID-STATE DISK (SSD) MANAGEMENT

(71) Applicant: Hewlett Packard Enterprise Development LP, Houston, TX (US)

(72) Inventor: Darren J. Cepulis, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/885,617

(22) Filed: Oct. 16, 2015

(65) Prior Publication Data

US 2016/0034208 A1 Feb. 4, 2016

Related U.S. Application Data

(63) Continuation of application No. 13/822,249, filed as application No. PCT/US2010/055158 on Nov. 2, 2010, now Pat. No. 9,195,588.

(51) Int. Cl.
| | |
|---|---|
| *G06F 3/06* | (2006.01) |
| *G06F 12/02* | (2006.01) |
| *G06Q 30/06* | (2012.01) |
| *G11C 16/34* | (2006.01) |

(52) U.S. Cl.
CPC .......... *G06F 3/0616* (2013.01); *G06F 3/0604* (2013.01); *G06F 3/0635* (2013.01); *G06F 3/0644* (2013.01); *G06F 3/0653* (2013.01); *G06F 3/0679* (2013.01); *G06F 3/0688* (2013.01); *G06F 12/0246* (2013.01); *G06Q 30/0631* (2013.01); *G06F 2206/1012* (2013.01); *G06F 2212/7211* (2013.01); *G11C 16/3495* (2013.01)

(58) Field of Classification Search
CPC ......... G06F 12/0246; G06F 2206/1012; G06F 2212/7211
USPC ....................................................... 711/103
See application file for complete search history.

(56) References Cited

U.S. PATENT DOCUMENTS

| | | | | |
|---|---|---|---|---|
| 7,809,900 | B2* | 10/2010 | Danilak | G06F 12/0246 |
| | | | | 711/100 |
| 7,865,761 | B1 | 1/2011 | Chilton | |
| 8,010,738 | B1* | 8/2011 | Chilton | G11C 16/349 |
| | | | | 711/103 |
| 8,239,617 | B1 | 8/2012 | Linnell | |
| 9,195,588 | B2* | 11/2015 | Cepulis | G06F 3/0616 |
| 2004/0177143 | A1 | 9/2004 | Maciel et al. | |
| 2008/0082725 | A1* | 4/2008 | Elhamias | G06F 12/0246 |
| | | | | 711/103 |
| 2009/0055465 | A1 | 2/2009 | DePue et al. | |
| 2009/0063895 | A1 | 3/2009 | Smith | |
| 2009/0300277 | A1* | 12/2009 | Jeddeloh | G06F 12/0246 |
| | | | | 711/104 |
| 2010/0082890 | A1 | 4/2010 | Heo et al. | |
| 2010/0088461 | A1 | 4/2010 | Yang et al. | |

(Continued)

OTHER PUBLICATIONS

Narayanan et al. "Migrating Server Storage to SSDs: Analysis of Tradeoffs." Apr. 2009. ACM. EuroSys '09.*

(Continued)

*Primary Examiner* — Nathan Sadler
(74) *Attorney, Agent, or Firm* — Hewlett Packard Enterprise Patent Department

(57) ABSTRACT

SSD wear-level data (320) is generated on managed nodes (202) having SSDs (206). The wear-level data is collected by a management node (204).

11 Claims, 3 Drawing Sheets

(56) References Cited

U.S. PATENT DOCUMENTS

| | | |
|---|---|---|
| 2010/0174851 A1 | 7/2010 | Leibowitz et al. |
| 2010/0250831 A1 | 9/2010 | O'Brien et al. |
| 2010/0262793 A1* | 10/2010 | Hetzler ............... G06F 12/0246 711/157 |
| 2011/0010487 A1 | 1/2011 | Sadovsky et al. |
| 2011/0035535 A1* | 2/2011 | Locasio ............... G11C 16/349 711/103 |
| 2011/0060865 A1 | 3/2011 | Warren et al. |
| 2011/0307679 A1 | 12/2011 | Roberts et al. |
| 2013/0179624 A1 | 7/2013 | Lambert et al. |
| 2014/0068153 A1 | 3/2014 | Gu et al. |

OTHER PUBLICATIONS

Clodoaldo Barrera et al, Solid State Disks for Enterprise Storage (Research Paper), Feb. 2009, 16 Pages.
http://www.hdsentinel.com/hard_disk_sentinel_enterprise.php, Mar. 2013.
http://www.hdsentinel.com/index.php, Mar. 2013.
International Searching Authority, The International Search Report and the Written Opinion, dated Aug. 29, 2011, 8 Pages.
Mark Anderson, et al., "Performance Value of Solid State Drivers using IBM i", May 2009, IBM. https://www.ibm.com/systems/resources/ssd_ibmi.pdf.
Pariseau Beth, http://searchstorage.techtarget.com/news/article/0,289142,sid5_gci1362680,00.html, Jul. 24, 2009.
Pinheiro et al, Failure Trends in a Large Disk Drive Population, USENIX FAST '07, Feb. 2007, 13 Pages.
Racheria et al, IBM Midrange System Storage Hardware Guide, IBM 2nd Ed, Mar. 2010, 27 Pages.

* cited by examiner

SOLID-STATE DISK (SSD) MANAGEMENT

CLAIM FOR PRIORITY

The present application is a Continuation of co-pending U.S. patent application Ser. No. 13/822,249, filed Mar. 11, 2013, which is a national stage filing under 35 U.S.C 371 of PCT application number PCT/US2010/055158, having an international filing date of Nov. 2, 2010, the disclosures of which are hereby incorporated by reference in their entireties.

BACKGROUND

Large computer installations can have thousands of components subject to failure and replacement. Accordingly, some computer management approaches monitor computer system health, e.g., by keeping track of data errors (even if they were corrected). Devices that generate excessive data errors can be targeted for replacement prior to a predicted failure. For example, hard disks can include controllers that detect and correct data errors and then log the occurrence of the error. Such techniques may also be applied to solid-state-disks (SSDs) which provide for higher performance than hard disks for increasingly affordable costs.

DETAILED DESCRIPTION

Figure 1:
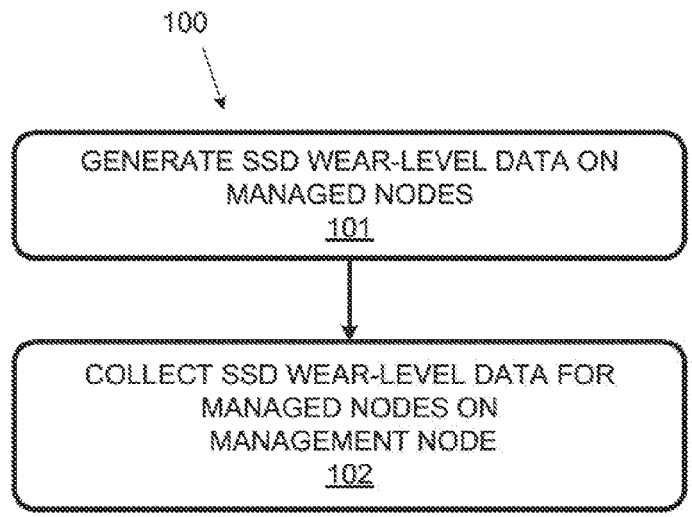
FIG. 1 is a flow chart of an SSD management process in accordance with an embodiment.

A process 100, flow charted in FIG. 1, includes a process segment 101 of generating SSD wear-level data on managed (computer) nodes, and collecting the generated wear-level data on a management node at process segment 102. Collecting wear-level data allows SSDs to be managed more as supplies (e.g., such as ink and toner cartridges) than as equipment, (e.g., such as hard disks). SSDs can accept only a limited number of writes before failure becomes likely. By tracking wear-level (a parameter related to the number of writes), failures can be anticipated much more reliably and earlier than hard disk failures are predicted using error events. Thus, planning for SSD replacements becomes more certain. Furthermore, the wear-level data can be used to adjust the workloads relying on an SSD to lengthen (or shorten) its useful lifetime.

Figure 2:
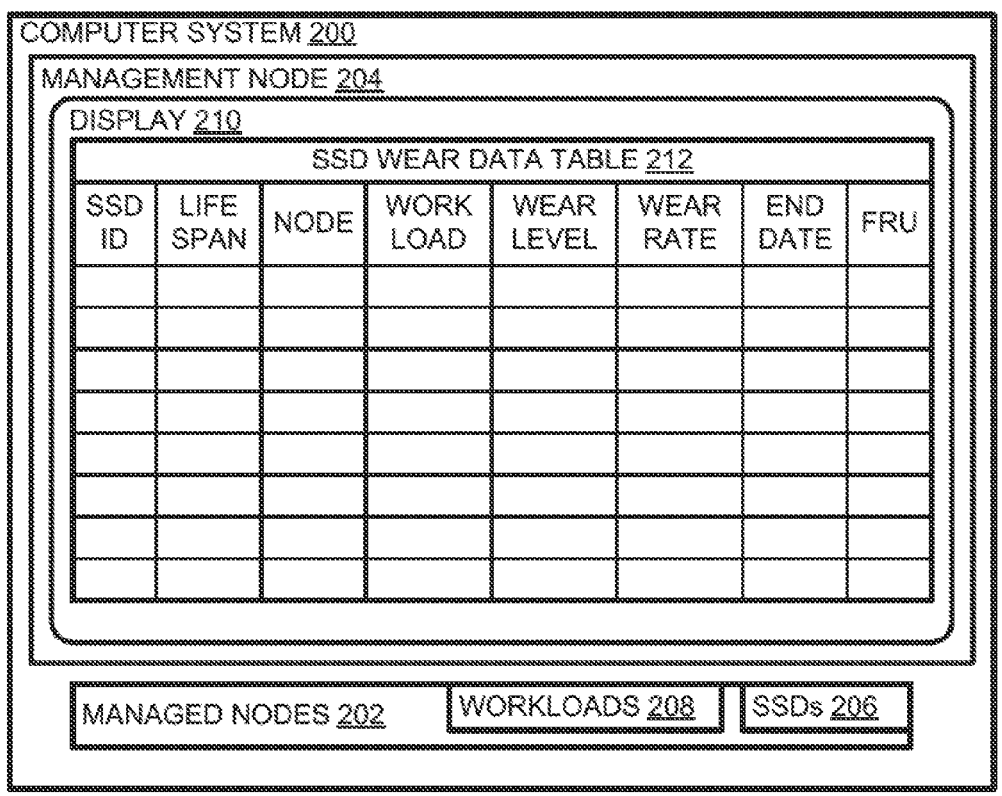
FIG. 2 is a block diagram of a computer system configured to employ the process of FIG. 1.

For example, a computer system 200 includes managed nodes 202 and a management node 204, as shown in FIG. 2. Managed nodes 202 can include SSDs 206 and run workloads 208 that access SSDs 206. Management node 204 includes as display 210 for displaying a table 212 of (shown unpopulated in FIG. 2) of SSD wear data. Table 212 associates wear-level data collected from managed nodes 202 with identities of the respective SSDs, their (manufacturer-specified) estimated life spans, workloads, and nodes. Life span can be represented as a number of writes, while wear-level can be represented as a percentage of the number of lifespan writes.

In addition, the SSD wear data of table 212 can include wear-rate data, which can be calculated by comparing previous and current wear-level data for an SSD. Also, the SSD wear data of table 212 can include end dates by which respective SSDs are to be replaced based on the current wear level and rate. Table 212 also includes an FRU (field-replaceable unit) field for identifying the recommended replacement component (e.g., SSD type and size or hard disk speed and size) for each SSD. In other embodiments, wear-level data is represented in other forms, and different parameters are associated with the wear-level data; for example, wear-level data can be represented for different time slots.

Figure 3:
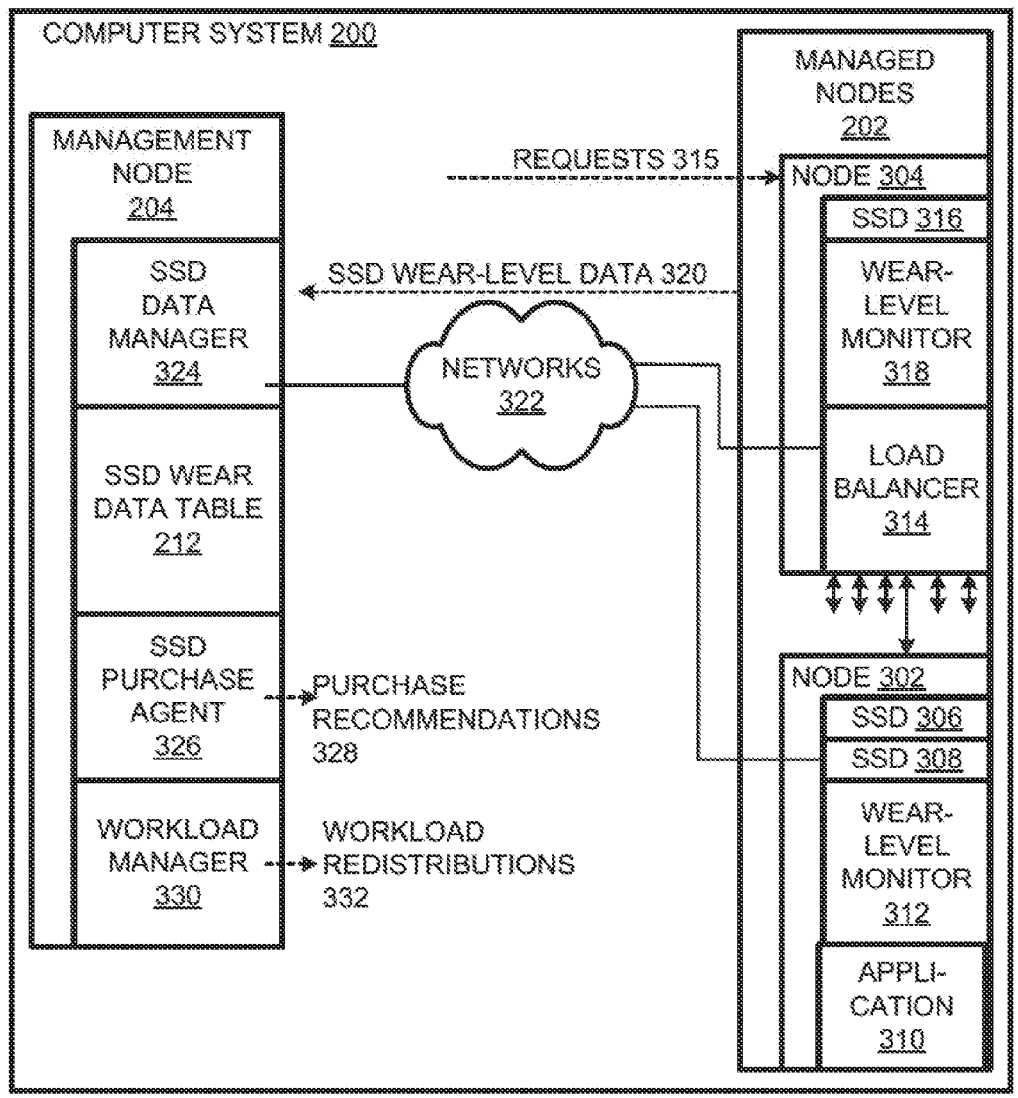
FIG. 3 is a more detailed block diagram of the system of FIG. 2.

As shown in FIG. 3, managed nodes 202 include application nodes such as node 302 and load balancing nodes, such as node 304. Application node 302 includes SSDs 306 and 308; node 302 is configured to execute an application 310 (e.g., a web server or a database) and an SSD wear-level monitor 312.

SSD monitor 312 can be implemented as a hardware-software combination. Embedded firmware on a drive controller, such as RAID (Redundant Array of Inexpensive Disks), HBA (Host Bus Adapter), etc., for node 302 can read the wear data from any SSD drives present and push this to an embedded Baseboard Management Chip (BMC). The BMC can log this data and make it visible over an out-of-band network to management node 204 via a Web-GUI (graphic user interface) and/or IPMI OEM (Intelligent Platform Interface, Original Equipment Manufacturer) command, or another industry standard mechanism. Also, storage management agents on each managed node can extract the SSD drive wear level data and communicate it to other nodes, e.g., management node 204 and/or load-balancing node 304 over an in-band network.

For example, SSD wear-level monitor 312 can transmit SSD wear-level data for SSDs 306 and 308 to load-balancing node 304. Load balancing node 304 is configured to distribute evenly incoming requests 315 among plural application nodes running instances of application 310. A load balancer 314 can base load balancing determination in part based on wear level data from the nodes its distributes to, e.g., to balance the rates at which SSD storage is written to across the nodes or to extend the remaining lifetimes of SSDs with more advanced wear levels.

Node 304 has its own SSD 316 and its own wear-level monitor 318, similar to wear-level monitor 312. Wear-level monitors, e.g., monitors 312 and 318, of managed nodes 202 can transmit their respective wear level data 320 to management node 204 via networks 322. Networks 322 can include an in-band network and an out-of-band management network connected to BMC-bearing internal lights out modules of managed nodes 202.

Wear-level data 320 is received by SSD data manager 324 of management node 204. Data manager 224 stores collected wear level data in table 212 in association with the SSDs and the nodes which generated the data. The wear-level and wear-rate data in table 212 can be extrapolated to project ends of the useful lifetimes of respective SSDs. The projected end dates can be used by SSD purchase agent 326 of management node 204 in making purchase recommendations 328 for SSD replacements. The projections may be made far enough in advance to take advantage of sales and quantity discounts.

A workload manager 330 can make use of the data in table 212 in planning workload redistributions 332. For example, if SSD 306 is suffering from an advanced wear level and a high wear rate, workload manager 324 can place the workload running on node 302 with a less demanding workload to extend the useful life (in days) of SSD 306. Also, workload manager 330 can manage workloads so that not all SSDs are replaced at once. For example, workload manager 330 can act to ensure that the date SSD 306 is to be replaced is not close to the date SSD 308 is to be replaced. This will allow node 302 to continue uninterrupted operation while a replacement SSD is purchased and hot-swapped for SSD 306. Other wear-level management programs can be implemented in accordance with the desires of the owner of computer system 200.

Figure 4:
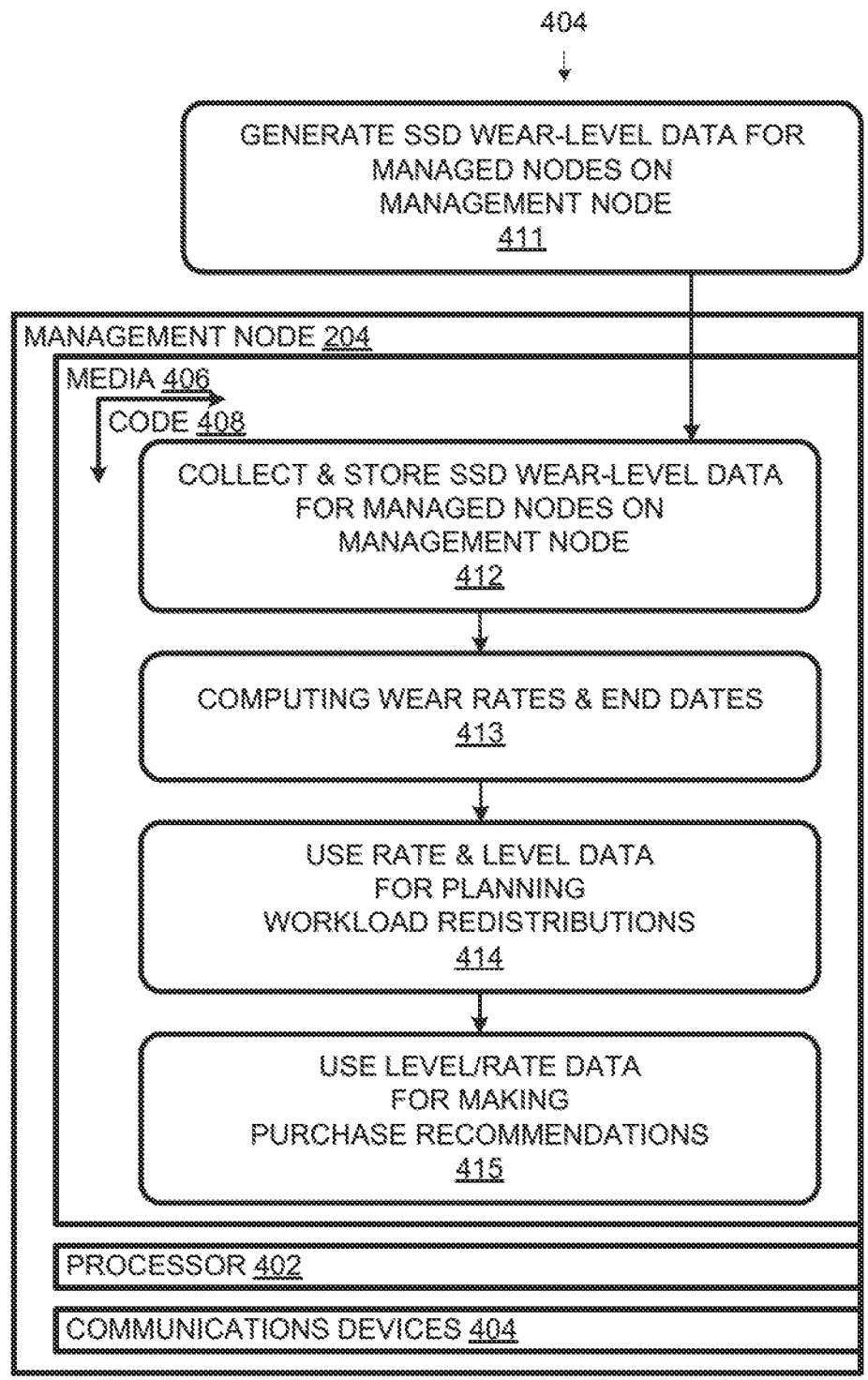
FIG. 4 is a combination block diagram and flow chart applicable to the system of FIG. 2.

As shown in FIG. 4, management node 204 includes a processor 402 (which can be a set of integrated circuits in a multi-processor or multi-core arrangement), communications devices 404 (including network interface cards, host bus adapters, and graphics and human (input/output) interface devices, and storage media 406. Storage media 406 can be encoded with, code 408 defining table 212, SSD data manager 324, SSD purchase agent 326, and workload manager 330.

Code 408 is configured to implement a process 404, flow charted in FIG. 4. At process segment 411 SSD monitors, including monitors 312 and 318, collect SSD wear-level data from respective nodes. They then transmit the data in association with data identifying the associated SSDs, nodes, and workloads.

At process segment 412, SSD data manager 324 receives, collects, and stores data from the managed nodes. SSD data manager 324 organizes the collected data and stores it in table 212. At process segment 413, wear rates can be computed by comparing current wear levels with past wear levels. Also, projected end dates can be computed from wear-levels and wear rates.

At process segment 414, workload manager 330 uses the wear-level and wear-rate data as factors in determining periodic workload redistributions. Other factors may include processor utilization, communications bandwidth utilization, power consumption, etc. The workload redistribution can be used to extend the lifetimes of heavily used SSDs, to implement a conveniently staggered replacement policy, or implement other management policies.

At process segment 415, SSD purchase agent 326 uses the wear level and wear rate data in making purchase recommendations. The wear-level and wear-rate data can be extrapolated to project an end of useful life data for each SSD. If replacement SSDs are to be replaced in batches, process segment 415 can provide for identifying which SSDs are to be replaced in the next batch rather than some batch to be purchased further in the future. Also, process segment 415 can make recommendations to replace an SSD with a hard disk, e.g., where there are frequent writes and performance can be less than maximal.

Herein, "storage media" refers to non-transitory tangible computer-readable storage media. Herein "code" refers to computer-readable data and computer-executable instructions. Herein, a "processor" is hardware configured to execute computer-executable instructions, whether that hardware is embodied in a single element (e.g. an integrated circuit) or distributed among plural elements. Herein, a "communications device" is a hardware element used to receive data into a node or transmit data from a node or both. Herein, a "node" is a computer element including a processor, storage media, and at least one communications device.

Herein, "SSD wear level data" includes data indicating the wear level of an SSD, e.g., in terms of a number of write operations or as a percent of estimated SSD lifespan. "SSD wear level data" also encompasses associated data such data identifying the relevant SSD, node, and workload. "SSD wear data" encompasses SSD wear level data and other data (e.g., wear rate and end date) computed using the SSD wear level data.

Herein, a "system" is a set of interacting elements, wherein the elements can be, by way of example and not of limitation, mechanical components, electrical elements, atoms, instructions encoded in storage media, and process segments. In this specification, related art is discussed for expository purposes. Related art labeled "prior art", if any, is admitted prior art. Related art not labeled "prior art", is not admitted prior art. The illustrated and other described embodiments, as well as modifications thereto and variations thereupon are within the scope of the following claims.

What is claimed is:

1. A method comprising:
   determining solid-state disk (SSD) wear-level data for SSDs on managed nodes, wherein the wear-level data includes frequency of writes;
   determining a recommendation to replace at least one of the SSDs with a hard disk or a replacement SSD based on the frequency of writes, wherein if performance is determined to be less than maximal, the recommendation is to replace the at least one SSD with the hard drive; otherwise the recommendation is to replace the at least one SSD with the replacement SSD; and
   balancing, by a management node, loads among the managed nodes based on the wear-level data.

2. The method of claim 1, comprising:
   storing the SSD wear-level data in a database of SSD wear data, wherein the stored SSD wear-level data comprises an identifier for each managed node and the wear-level data for each managed node, and the wear-level data is associated with the identifier of the corresponding managed node.

3. The method of claim 1, wherein balancing loads comprises:
   determining workload redistributions among the SSDs so as to stagger times at which each SSD is replaced.

4. The method of claim 1, wherein determining SSD wear-level data comprises:
   receiving, at one of the managed nodes, the wear-level data from each of the other managed nodes, wherein the wear-level data of each of the SSDs is measured at the managed node including the SSD.

5. The method of claim 1, wherein determining SSD wear-level data comprises:
   receiving, at the management node, the wear-level data for each of the SSDs, wherein the wear-level data of each of the SSDs is measured at the managed node including the SSD.

6. A management node comprising:
   a processor to:
   receive SSD wear-level data for each SSD of a plurality of SSDs on nodes, wherein the SSD wear-level data for each SSD includes frequency of writes;
   compute wear-rate based on the frequency of writes for each SSD from the SSD wear-level data for the SSD, wherein the wear-rate is a rate of change of wear calculated based on previous SSD wear-level data and current wear-level data determined from the SSD wear-level data;
   determining a recommendation to replace at least one of the SSDs with a hard disk or a replacement SSD based on the frequency of writes, wherein if performance is determined to be less than maximal, the recommendation is to replace the at least one SSD with the hard drive; otherwise the recommendation is to replace the at least one SSD with the replacement SSD; and redistribute loads among the nodes based on wear-rate of each SSD of the plurality of SSDs to extend the lifetimes of some SSDs.

7. The management node of claim 6, wherein the management node redistributes the load to control rates at which the plurality of SSDs are written to.

8. The management node of claim 7, wherein the management node redistributes the load to balance the rates at which the plurality of SSDs are written to.

9. The management node of claim 7, wherein to facilitate the management node redistributes the load to extend remaining lifetime of the plurality of SSDs and controls the rates at which the plurality of SSDs are written to based on the determined redistribution.

10. A computer system comprising:
a processor; and
a non-transitory computer readable medium storing machine readable instructions executable by the processor to:
collect SSD wear-level data for each of a plurality of SSDs from managed nodes having the plurality of SSDs, wherein the SSD wear-level data for each SSD includes frequency of writes;
compute wear-rate for each SSD based on the frequency of writes from the SSD wear-level data for the SSD, wherein the wear-rate is a rate of change of wear calculated based on previous SSD wear-level data and current wear-level data determined from the SSD wear-level data; and generate a recommendation to replace an SSD of the plurality of SSDs with a hard disk or a replacement SSD based on the wear-rate for the SSD, wherein if performance is less than a maximal value determined based on the wear-rate for the SSD, the recommendation is to replace the SSD with the hard disk; otherwise the recommendation is to replace the SSD with the replacement SSD.

11. The computer system of claim 10, wherein the processor is to balance loads among the SSDs based on the wear-rate of each of the SSDs.

\* \* \* \* \*